(12) United States Patent
Nakamura et al.

(10) Patent No.: US 10,351,166 B2
(45) Date of Patent: *Jul. 16, 2019

(54) SENSOR DEVICE AND ELECTRIC POWER STEERING APPARATUS USING SAME

(71) Applicant: DENSO CORPORATION, Kariya, Aichi-pref. (JP)

(72) Inventors: Koichi Nakamura, Kariya (JP); Katsuhiko Hayashi, Kariya (JP); Takaharu Kozawa, Kariya (JP); Shuji Kuramitsu, Kariya (JP); Masaya Taki, Kariya (JP); Toshimitsu Sakai, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 277 days.

This patent is subject to a terminal disclaimer.

(21) Appl. No.: 15/158,207

(22) Filed: May 18, 2016

(65) Prior Publication Data

US 2016/0339948 A1 Nov. 24, 2016

(30) Foreign Application Priority Data

May 20, 2015 (JP) .................................. 2015-102774

(51) Int. Cl.
*B62D 5/04* (2006.01)
*G01L 3/10* (2006.01)
(Continued)

(52) U.S. Cl.
CPC .............. *B62D 5/049* (2013.01); *B62D 1/04* (2013.01); *B62D 6/10* (2013.01); *G01D 5/24461* (2013.01);
(Continued)

(58) Field of Classification Search
CPC ........ B62D 5/049; B62D 5/0463; B62D 1/04; B62D 1/16; B62D 6/10; G01L 3/00; G01L 3/10; G01R 33/04; G01R 33/072
See application file for complete search history.

(56) References Cited

U.S. PATENT DOCUMENTS

2010/0004817 A1 * 1/2010 Nakane ................ B62D 5/0484
701/33.4
2011/0087456 A1 * 4/2011 Satou ..................... B62D 5/049
702/151

(Continued)

FOREIGN PATENT DOCUMENTS

EP          1503184 A2 *  2/2005  ............. G01D 5/145
JP       2008232728 A  * 10/2008

OTHER PUBLICATIONS

U.S. Appl. No. 15/158,283, filed May 18, 2016, Takaharu Kozawa, et al.

(Continued)

*Primary Examiner* — Joseph M Rocca
*Assistant Examiner* — Maurice L Williams
(74) *Attorney, Agent, or Firm* — Knobbe, Martens, Olson & Bear, LLP

(57) ABSTRACT

A sensor device includes a first sensor section and a second sensor section, and the first sensor section has sensor elements and an output circuit for generating and transmitting an output signal including signals that respectively correspond to sensing values from the two sensor elements, and the second sensor section has sensor elements and an output circuit for generating and transmitting an output signal including signals that respectively correspond to sensing values from the two sensor elements. The sensor device further includes an ECU that has an abnormality determiner for determining abnormality of the sensor sections, and a calculator, thereby enabling a continuation of abnormality (Continued)

monitoring of a normal sensor section, even when a part of the sensor sections is abnormal.

12 Claims, 11 Drawing Sheets

(51) Int. Cl.
G01R 33/04 (2006.01)
B62D 1/04 (2006.01)
B62D 6/10 (2006.01)
G01R 33/07 (2006.01)
G01D 5/244 (2006.01)

(52) U.S. Cl.
CPC .............. *G01L 3/104* (2013.01); *G01R 33/04* (2013.01); *G01R 33/072* (2013.01)

(56) References Cited

U.S. PATENT DOCUMENTS

| | | | | |
|---|---|---|---|---|
| 2013/0132832 | A1* | 5/2013 | Nakamura | G06F 17/24 715/271 |
| 2013/0253773 | A1* | 9/2013 | Itamoto | B62D 5/049 701/43 |
| 2013/0264915 | A1* | 10/2013 | Suzuki | B62D 5/0484 310/68 B |
| 2013/0319100 | A1 | 12/2013 | Kichise | |
| 2014/0130612 | A1 | 5/2014 | Takahashi et al. | |
| 2014/0180544 | A1* | 6/2014 | Itamoto | B62D 5/049 701/41 |
| 2014/0360803 | A1* | 12/2014 | Hori | B62D 5/0484 180/446 |
| 2015/0066301 | A1* | 3/2015 | Kozawa | B62D 5/0463 701/41 |
| 2015/0066306 | A1* | 3/2015 | Kodera | B62D 5/0466 701/43 |
| 2015/0226627 | A1* | 8/2015 | Kuwahara | B62D 5/049 701/41 |
| 2015/0239494 | A1* | 8/2015 | Fukunaga | H04Q 9/00 701/43 |
| 2016/0097825 | A1* | 4/2016 | Petrie | G01R 33/072 324/207.22 |
| 2017/0001661 | A1 | 1/2017 | Nakamura | |
| 2017/0050670 | A1* | 2/2017 | Kuramitsu | B62D 5/0484 |

OTHER PUBLICATIONS

U.S. Appl. No. 15/158,189, filed May 18, 2016, Shuji Kuramitsu, et al.

* cited by examiner

SENSOR DEVICE AND ELECTRIC POWER STEERING APPARATUS USING SAME

CROSS REFERENCE TO RELATED APPLICATION

The present application is based on and claims the benefit of priority of Japanese Patent Application No. 2015-102774, filed on May 20, 2015, the disclosure of which is incorporated herein by reference.

TECHNICAL FIELD

The present disclosure generally relates to a sensor device and an electric power steering apparatus using such a sensor device.

BACKGROUND INFORMATION

Generally, the sensor device (i.e., a torque sensor) is configured to detect the magnetic flux passing through the sensor device, for detecting a steering torque, for example. In a patent document, JP 2014-115270 A (patent document 1), the torque sensor is described as having a comparator disposed therein, for detecting a fault of a magnetic sensor.

In the sensor device of the patent document 1, one sensor section has two magnetic flux sensor elements. However, from the sensor section, only one sensing value is output. Therefore, on an ECU side, an output signal specific to one of the two magnetic flux sensor elements is not usable.

SUMMARY

It is an object of the present disclosure to provide a sensor device that enables a controller to use an element-specific sensing value.

In an aspect of the present disclosure, the sensor device includes a plurality of sensor sections and a controller.

The sensor section has a plurality of sensor elements and an output circuit. Each of the plurality of the sensor element senses a first physical quantity of a sensing object. The output circuit generates and transmits an output signal that includes a data signal corresponding to the sensing value sensed by each of the plurality of sensor elements.

The controller has a signal obtainer, an abnormality determiner, and a calculator. The signal obtainer obtains the output signal. The abnormality determiner determines abnormality of the sensor section. The calculator calculates a second physical quantity based on a normal output signal from the sensor section.

According to the present disclosure, the output signal is generated as (i.e., includes) the data signal corresponding to the sensing value sensed by each of the plurality of sensor elements, and the output signal is transmitted to the controller by digital communication. In such manner, the controller is enabled to use the output signal that corresponds to the sensing value of each of the plurality of sensor elements.

Further, even when a part of the plurality of sensor sections has abnormality, a sensor section is enabled to be continuously self-monitored. That is, since each of the sensor sections has the plurality of sensor elements, thereby the self-monitoring of a normal sensor section is continuable based on the sensing value sensed by the plurality of the sensor elements. Therefore, even when a part of the plurality of sensor sections has abnormality, the calculation of the second physical quantity is continuable with the same accuracy as the normal time (i.e., when all sensor sections are normal), while continuing the self-monitoring of the normal sensor section.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Hereafter, a sensor device regarding the present disclosure is described based on the drawings.

Hereafter, same numerals are assigned to same components in the following embodiments, and descriptions of the same components are not repeated.

First Embodiment

The first embodiment of the present disclosure is described based on FIGS. 1-6.

Figure 1:
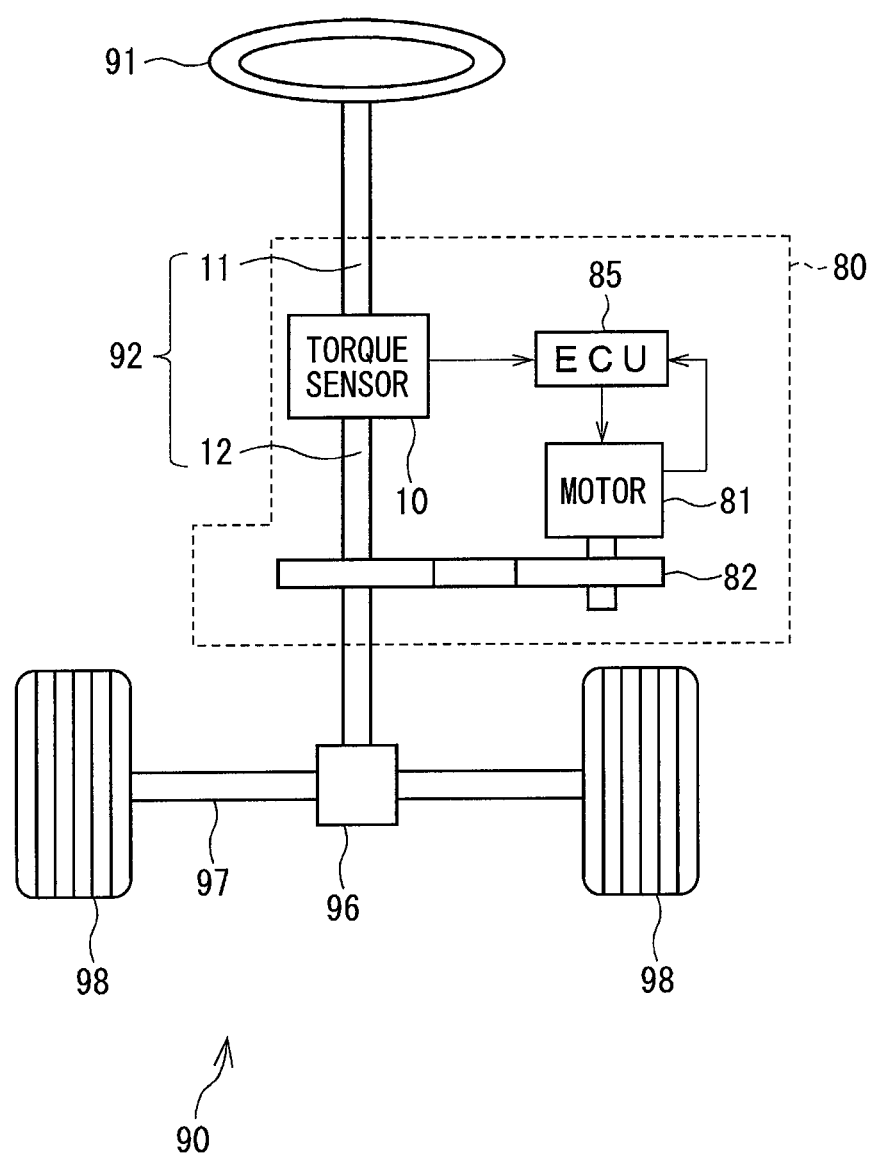
FIG. 1 is a block diagram of an electric power steering apparatus in a first embodiment of the present disclosure.
Figure 2:
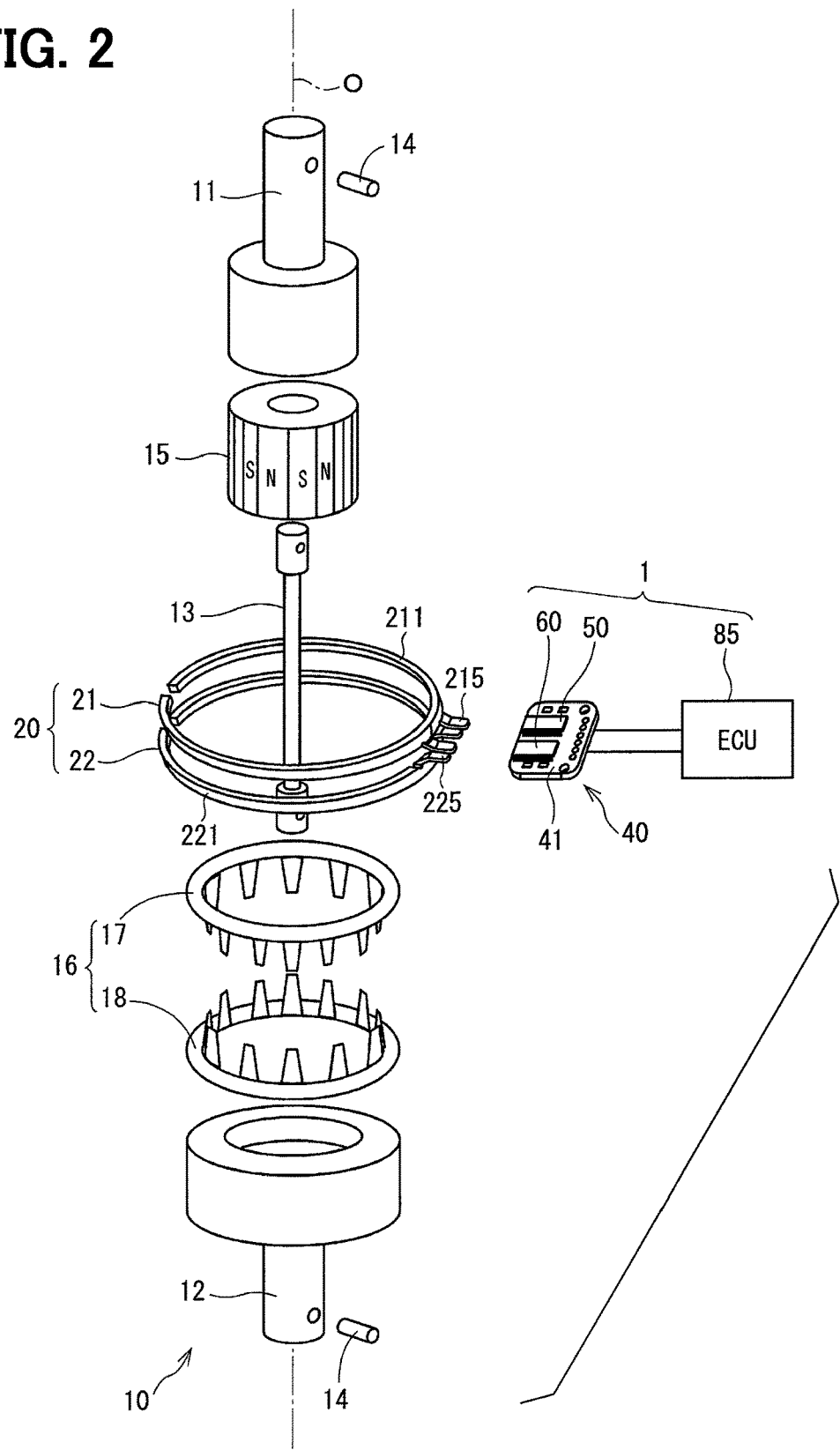
FIG. 2 is an exploded perspective view of a torque sensor in the first embodiment of the present disclosure.

As shown in FIGS. 1 and 2, a sensor device 1 is applied to an electric power steering apparatus 80, in which an Electric Control Unit (ECU) 85 serving as a controller is provided together with a first magnetic sensor 50, a second magnetic sensor 60, and the like, for example, for assisting a steering operation of a vehicle.

The entire configuration of a steering system 90 having the electric power steering apparatus 80 is shown in FIG. 1.

A steering wheel 91 as a steering component is connected with a steering shaft 92.

The steering shaft 92 has an input shaft 11 as a first shaft, and has an output shaft 12 as a second shaft. The input shaft 11 is connected with the steering wheel 91. At a position between the input shaft 11 and the output shaft 12, a torque sensor 10 detecting a torque applied to the steering shaft 92 is disposed. A pinion gear 96 is disposed on one end of the output shaft 12 opposite to the input shaft 11. The pinion gear 96 engages with a rack shaft 97. A pair of wheels 98 is connected with both ends of the rack shaft 97 via a tie rod etc.

When a driver rotates the steering wheel 91, the steering shaft 92 connected with the steering wheel 91 rotates. The rotation of the steering shaft 92 is turned into a translational motion of the rack shaft 97 by the pinion gear 96, and the pair of wheels 98 is steered by an angle according to an amount of displacement of the rack shaft 97.

The electric power steering apparatus 80 is provided with a motor 81 that outputs an assist torque for assisting a steering operation of the steering wheel 91 by the driver, a speed reduction gear 82 serving as a power transmission part, the torque sensor 10, ECU 85 and the like. Although the motor 81 and ECU 85 have separate bodies in FIG. 1, they may be combined to have one body.

The speed reduction gear 82 reduces a rotation speed of the motor 81, and transmits the rotation of the motor 81 to the steering shaft 92. That is, although the electric power steering apparatus 80 of the present embodiment is a "column assistant type", the apparatus 80 may also be a "rack assist type" that transmits rotation of the motor 81 to the rack shaft 97. In other words, although the steering shaft 92 is a "drive object" in the present embodiment, the rack shaft 97 may also be a "drive object." The details of ECU 85 are mentioned later.

As shown in FIG. 2, the torque sensor 10 is provided with the input shaft 11, the output shaft 12, a torsion bar 13, a multipolar magnet 15, a magnetic yoke 16, a magnetic flux collection module 20 as a sensing object, a sensor unit 40 and the like.

The torsion bar 13 has one end connected with the input shaft 11 and the other end connected with the output shaft 12 by a pin 14, respectively, and connects the input shaft 11 and the output shaft 12 on the same axis (i.e., coaxially connects the shaft 11 and the shaft 12 on a rotation axis O). The torsion bar 13 is an elastic member in a rod shape, and converts a torque applied to the steering shaft 92 into a twist displacement.

The multipolar magnet 15 is formed in a cylinder shape, and is fixed to the input shaft 11. On the multipolar magnet 15, an N pole and an S pole are magnetized by turns along a periphery. Although the number of poles may be arbitrarily determined, the number of N poles and S poles is configured to be 12 pairs, having a total of 24 poles in the present embodiment.

The magnetic yoke 16 is held by a yoke attachment component which is formed by a nonmagnetic material (e.g., resin) (not illustrated), and forms a magnetic circuit in a magnetic field that is generated by the multipolar magnet 15.

The magnetic yoke 16 includes a first yoke 17 and a second yoke 18, and the first yoke 17 is disposed on one side of the yoke 16 close to the input shaft 11, and the second yoke 18 is disposed on the other side of the yoke 16 close to the output shaft 12. Both of the first yoke 17 and the second yoke 18 have an annular shape, and are made with a soft magnetic material, and are fixedly attached to the output shaft 12 on a radius outside of the multipolar magnet 15.

The magnetic flux collection module 20 includes magnetic flux collection rings 21 and 22. The magnetic flux collection rings 21 and 22 are arranged on a radius outside of the magnetic yoke 16, and collect the magnetic flux from the magnetic yoke 16. A first magnetic flux collection ring 21 is disposed on one side of the module 20 close to the input shaft 11, and a second magnetic flux collection ring 22 is disposed on the other side of the module 20 close to the output shaft 12. The first magnetic flux collection ring 21 and the second magnetic flux collection ring 22 are held by a non-illustrated magnetic flux collection ring holder member that is formed by an insert molding etc.

The first magnetic flux collection ring 21 comprises (i) a ring part 211 that is made with the soft magnetic material substantially in a ring shape and (ii) two magnetic flux collecting parts 215 projecting toward a radius outside from the ring part 211. The number of the magnetic flux collecting parts 215 may be configured to match the number of sensor parts 55, 65 mentioned in the following.

The second magnetic flux collection ring 22 comprises (i) a ring part 221 that is made with the soft magnetic material substantially in a ring shape, just like the first magnetic flux collection ring 21, and two magnetic flux collecting parts 225 projecting toward a radius outside from the ring part 221.

In the present embodiment, the first magnetic flux collection ring 21 and the second magnetic flux collection ring 22 have substantially the same form.

The magnetic flux collecting part 215 of the first magnetic flux collection ring 21 and the magnetic flux collecting part 225 of the second magnetic flux collection ring 22 are disposed to face each other, and have respective facing surfaces arranged substantially in parallel.

The magnetic sensors 50 and 60 are arranged at a position between the magnetic flux collecting parts 215 and 225.

The sensor unit 40 includes a substrate 41 and the magnetic sensors 50 and 60.

The substrate 41 is formed in a plate-like, approximately rectangular shape, and the magnetic sensors 50 and 60 are mounted on the substrate 41. The magnetic sensors 50 and 60 are mounted on the same surface of the substrate 41.

The first magnetic sensor 50 outputs a first output signal Sd10 to ECU 85 at a constant interval, and the second magnetic sensor 60 outputs a second output signal Sd20 to ECU 85 at a constant interval.

Figure 3:
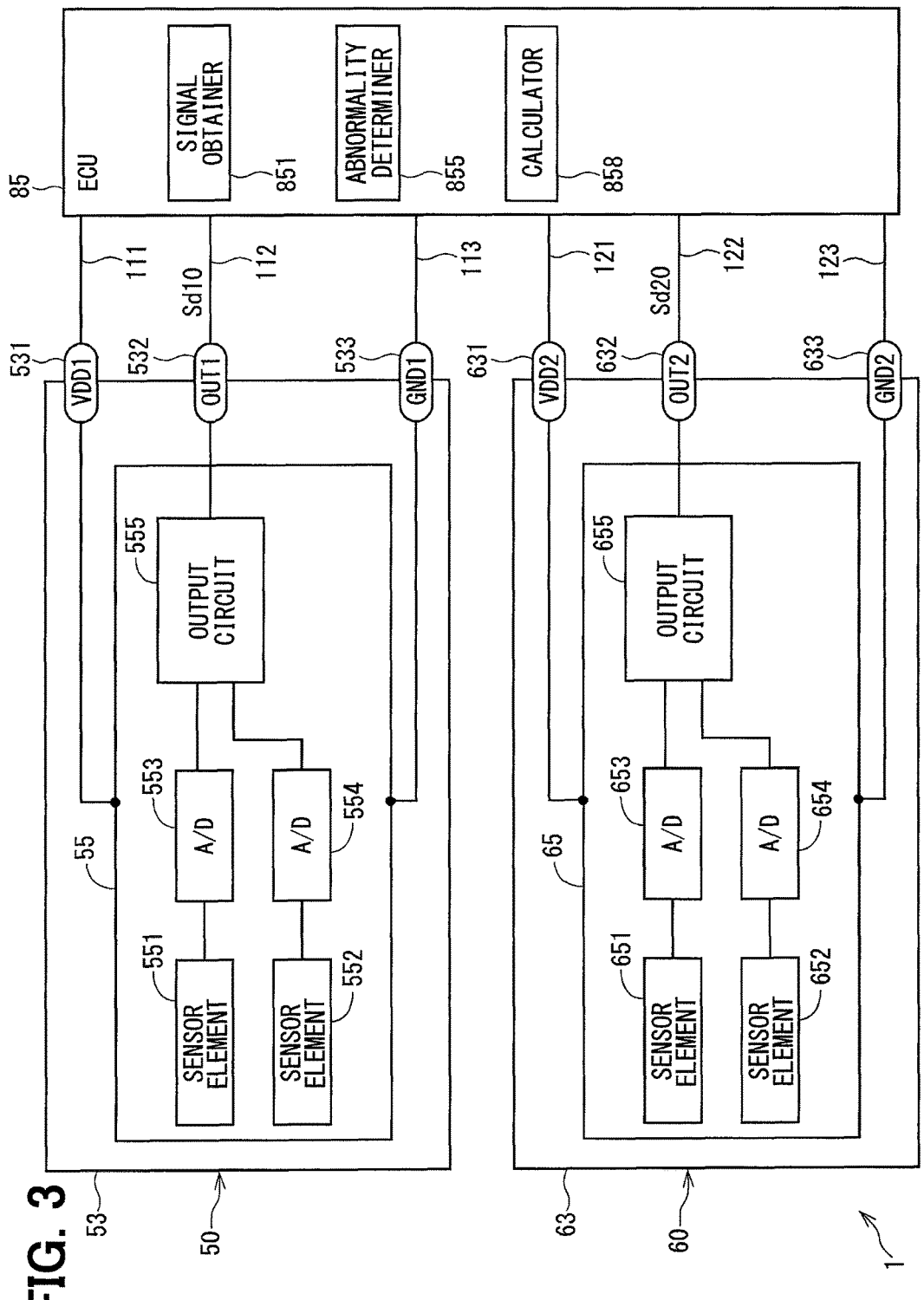
FIG. 3 is a block diagram of a sensor device in the first embodiment of the present disclosure.

As shown in FIG. 3, the first magnetic sensor 50 has a sealed part 53 and a first sensor section 55, and the second magnetic sensor 60 has a sealed part 63 and a second sensor section 65.

The configuration concerning the first magnetic sensor 50 is hereafter designated as 50-something numbers or 500-something numbers, and the configuration concerning the second magnetic sensor 60 is hereafter designated as 60-something numbers or 600-something numbers, suggesting that the same last one digit or last two digits indicate the same component/configuration. Hereafter, the description is focused on the first magnetic sensor 50, and the same configuration of the sensor 60 may be not repeated whenever appropriate.

The sealed part 53 seals the first sensor section 55 implemented as a semiconductor chip or the like, substantially in a flat and rectangular shape. The sealed part 53 has a power supply terminal 531, a communication terminal 532, and a ground terminal 533 respectively disposed on the sealed part 53 and projecting from the sealed part 53.

The power supply terminal 531 of the first magnetic sensor 50 is connected to ECU 85 by a first power source line 111, and the communication terminal 532 of the first magnetic sensor 50 is connected to ECU 85 by a first communication line 112, and the ground terminal 533 of the first magnetic sensor 50 is connected to ECU 85 by a first ground line 113.

Further, in the second magnetic sensor 60, a power supply terminal 631 is connected to ECU 85 by a second power source line 121, and a communication terminal 632 is connected to ECU 85 by a second communication line 122, and a ground terminal 633 is connected to ECU 85 by a second ground line 123.

The voltage adjusted to a predetermined voltage value (e.g., 5 M) is supplied to the power supply terminals 531 and 631 from a regulator of ECU 85 which is not illustrated. The ground terminals 533 and 633 are connected with the ground via ECU 85.

The communication terminal 532 and the first communication line 112 are used for communications between the first magnetic sensor 50 and ECU 85. According to the present embodiment, the first output signal Sd10 is transmitted to ECU 85 from the first magnetic sensor 50 via the communication terminal 532 and the first communication line 112.

Further, the communication terminal 632 and the second communication line 122 are used for communications between the second magnetic sensor 60 and ECU 85. According to the present embodiment, the second output signal Sd20 is transmitted to ECU 85 from the second magnetic sensor 60 via the communication terminal 632 and the second communication line 122.

The first sensor section 55 includes a first main sensor element 551, a first sub sensor element 552, Analog/Digital (A/D)-conversion circuits 553 and 554, a first output circuit 555, and the like.

The sensor elements 551 and 552 are respectively a magnetic flux detecting element that detects the magnetic flux between the magnetic flux collecting parts 215 and 225. The sensor elements 551 and 552 in the present embodiment are respectively implemented as a Hall element. Even though the sensor elements 551 and 552 are designated as "main" and "sub" elements in the present embodiment, for a distinction of signal orders (i.e., a sequence of signals), in the first output signal Sd10, the first main sensor element 551 and the first sub sensor element 552 are substantially the same element.

The A/D-conversion circuit 553 performs an A/D conversion of a sensing value detected by the first main sensor element 551. The A/D-conversion circuit 554 performs an A/D conversion of a sensing value detected by the first sub sensor element 552.

The first output circuit 555 generates the first output signal Sd10 based on the sensing values which have been detected by the sensor elements 551 and 552 and which have been A/D-converted.

The first output signal Sd10 generated thereby is transmitted to ECU 85 via the communication terminal 532 by a Single Edge Nibble Transmission (SENT) communication method at a preset internal, which is one type of digital communication.

The second output circuit 655 generates the second output signal Sd20 based on the sensing value that has been detected by the sensor elements 651 and 652, and A/D converted.

The second output signal Sd20 generated by the second output circuit 655 is transmitted to ECU 85 via the communication terminal 632 at a preset interval by the SENT communication method.

The details of the output signals Sd10 and Sd20 are mentioned later.

ECU 85 is constituted by a microcontroller etc., and has a signal obtainer 851, an abnormality determiner 855, a calculator 858 and the like as functional blocks.

The signal obtainer 851 obtains the output signals Sd10 and Sd20 that are transmitted from the magnetic sensors 50 and 60.

The abnormality determiner 855 determines abnormality of the sensor sections 55, 65.

The details of the abnormality determination are mentioned later.

The calculator 858 performs various calculations by using a data value that corresponds to the sensing value of the sensor section that has no abnormality caused therein. According to the present embodiment, the calculator 858 calculates a steering torque based on the data value. The calculated steering torque is then used for a drive control of the motor 81. More practically, the calculator 858 calculates a torque instruction value based on the steering torque. ECU 85 controls a drive of the motor 81 by a conventional method (e.g., by a feedback control), based on the torque instruction value.

Each of the processes performed in ECU 85 may be a software process by executing a program pre-memorized in CPU, or may be a hardware process performed by a dedicated electronic circuit.

Figure 4:
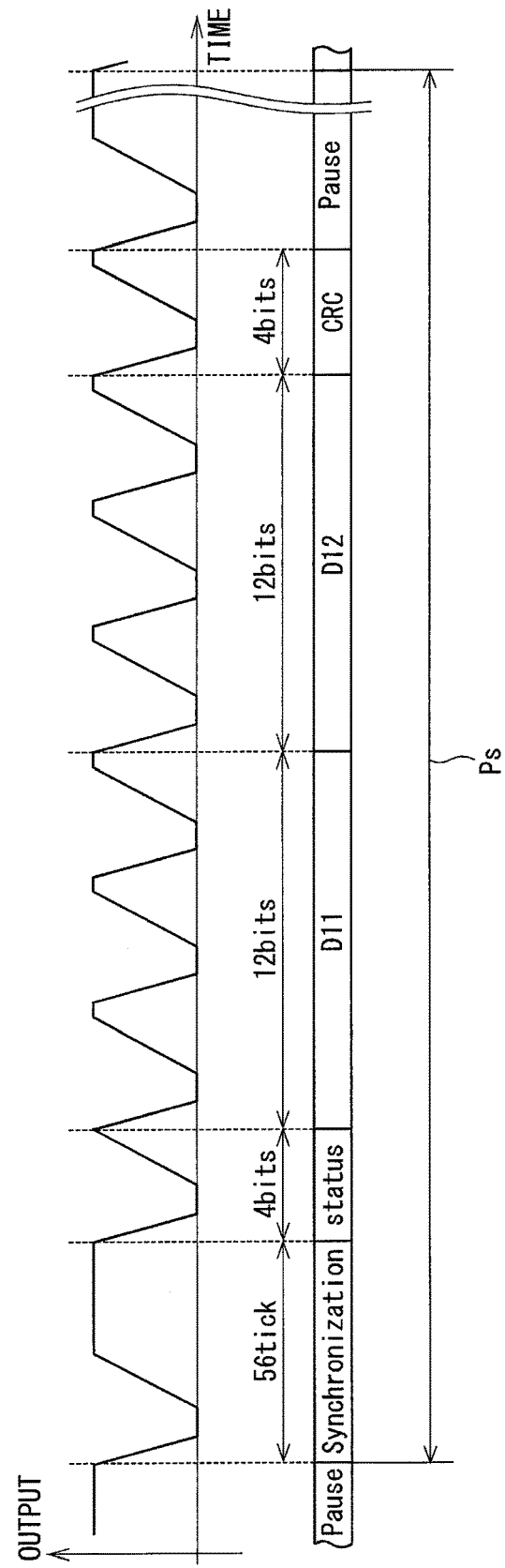
FIG. 4 is a time chart of an output signal in the first embodiment of the present disclosure.

The details of the first output signal Sd10 are described based on FIG. 4.

The number of bits and the like in FIG. 4 are just an example, and are suitably set up according to the telecommunication standard etc.

As shown in FIG. 4, the first output signal Sd10 consists of a synchronization signal, a status signal, a first main signal D11, a first sub signal D12, a Cyclic Redundancy Check (CRC) signal, and a pause signal, and the first output signal Sd10 is outputted as a series of signals in this order.

The second output signal Sd20 consists of the status signal, a second main signal D21, a second sub signal D22, the CRC signal, and the pause signal, and the second output signal Sd20 is outputted as a series of signals in this order.

Since the first output signal Sd10 and the second output signal Sd20 are substantially the same, the following descriptions focus on the first output signal Sd10.

The synchronization signal is a signal for synchronizing the magnetic sensor 50 and the clock of ECU 85, and is set to 56tick in the present embodiment.

In the present embodiment, a correction coefficient is calculated based on the length of the synchronization signal, and each signal is corrected by using the correction coefficient. The signal corrected with the correction coefficient is used for the abnormality determination process described below.

The first main signal D11 is a signal based on the sensing value of the sensor element 551, and the first sub signal D12 is a signal based on the sensing value of the sensor element 552. In the present embodiment, the first main signal D11 and the first sub signal D12 are generated based on the sensing values of the sensor elements 551 and 552 at a signal generation time.

The sensing values may also be updated at a cycle shorter than a signal cycle Ps of the first output signal Sd10, and the signals D11, D12, D21, D22 may be respectively generated based on using the latest sensing values.

Both of the first main signal D11 and the first sub signal D12 are 3 nibbles (=12 bits), and have a total of 6 nibbles as a data part. The data contents are represented at least by 1 nibble, which is defined according to the communication specification.

In the present embodiment, an internal process of the first sensor section 55 does not involve an aggregation process of making up one aggregated data by an addition/subtraction/multiplication/division etc. of many sensing values from the sensor elements 551 and 552 or a selection process of selecting one of many sensing values. That is, the sensing values from the sensor elements 551, 552 are used "as is" to generate the first main signal D11 and the first sub signal D12 for the utilization of each of the sensing values in ECU 85.

The same applies to the second main signal D21 and the second sub signal D22.

Figure 5:
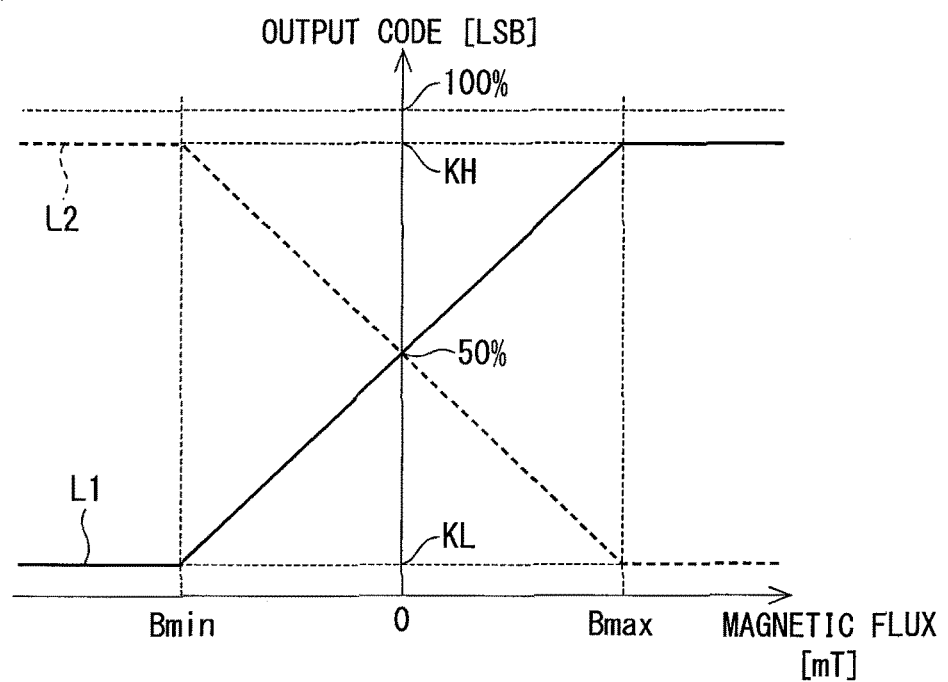
FIG. 5 is an illustration diagram of a first main data value and first sub-data value in the first embodiment of the present disclosure.

As shown in FIG. 5, the first main signal D11 and the first sub signal D12 are the signals according to the magnetic flux between the magnetic flux collecting parts 215 and 225, and are reversed from each other about a certain center value. In the present embodiment, the certain center value is a 50% value of an output code.

More practically, as shown by a solid line L1, the first main signal D11 takes a lower limit value KL when the magnetic flux density is equal to or less than Bmin, and takes an upper limit value KH when the magnetic flux density is equal to or greater than Bmax, and the signal value of D11 increases as the magnetic flux density increases from Bmin to Bmax.

Further, as shown by a dashed line L2, the first sub signal D12 takes the upper limit value KH when the magnetic flux density is equal to or less than Bmin, and takes the lower limit value KL when the magnetic flux density is equal to or greater than Bmax, and the signal value of D12 decreases as the magnetic flux density increases from Bmin to Bmax. Note that the value KL may be equal to 0%, and the value KH may be equal to 100%.

In FIG. 4, the first main signal D11 and the first sub signal D12 are illustrated as an identical pulse for illustration and simplification. However, the pulses for the signals D11 and D12 are actually the reversed pulses about a certain center value, according to the sensing value of the magnetic flux density.

The second main signal D21 is a signal that increases, just like the first main signal D11, as the magnetic flux density increases, and the second sub signal D22 is a signal that decreases, just like the first sub signal D12, as the magnetic flux density increases.

Alternatively, the second main signal D21 may be configured to be similar to the first sub signal D12, and the second sub signal D22 may be configured to be similar to the first main signal D11.

According to the present embodiment, since the first main signal D11 and the first sub signal D12 are reversed from each other, the sum of the first main signal D11 and the first sub signal D12 is calculated as a preset value (henceforth a "theoretical addition value Va").

According to the present embodiment, since the first main signal D11 and the first sub signal D12 are respectively a signal of 3 nibbles, the theoretical addition value Va is the maximum value "FEE" which is the maximum of the binary data in 3 digits. Further, when either of the first main signal D11 or the first sub signal D12 has abnormality, the sum of the first main signal D11 and the first sub signal D12 is calculated as a different value which is different from the theoretical addition value Va.

The same applies to the second main signal D21 and the second sub signal D22.

Returning to FIG. 4, the CRC signal is a signal for detecting the communication error, and the length of the CRC signal is calculated based on the signals D11 and D12.

The pause signal is a signal outputted in a period before outputting the following synchronization signal.

Figure 6:
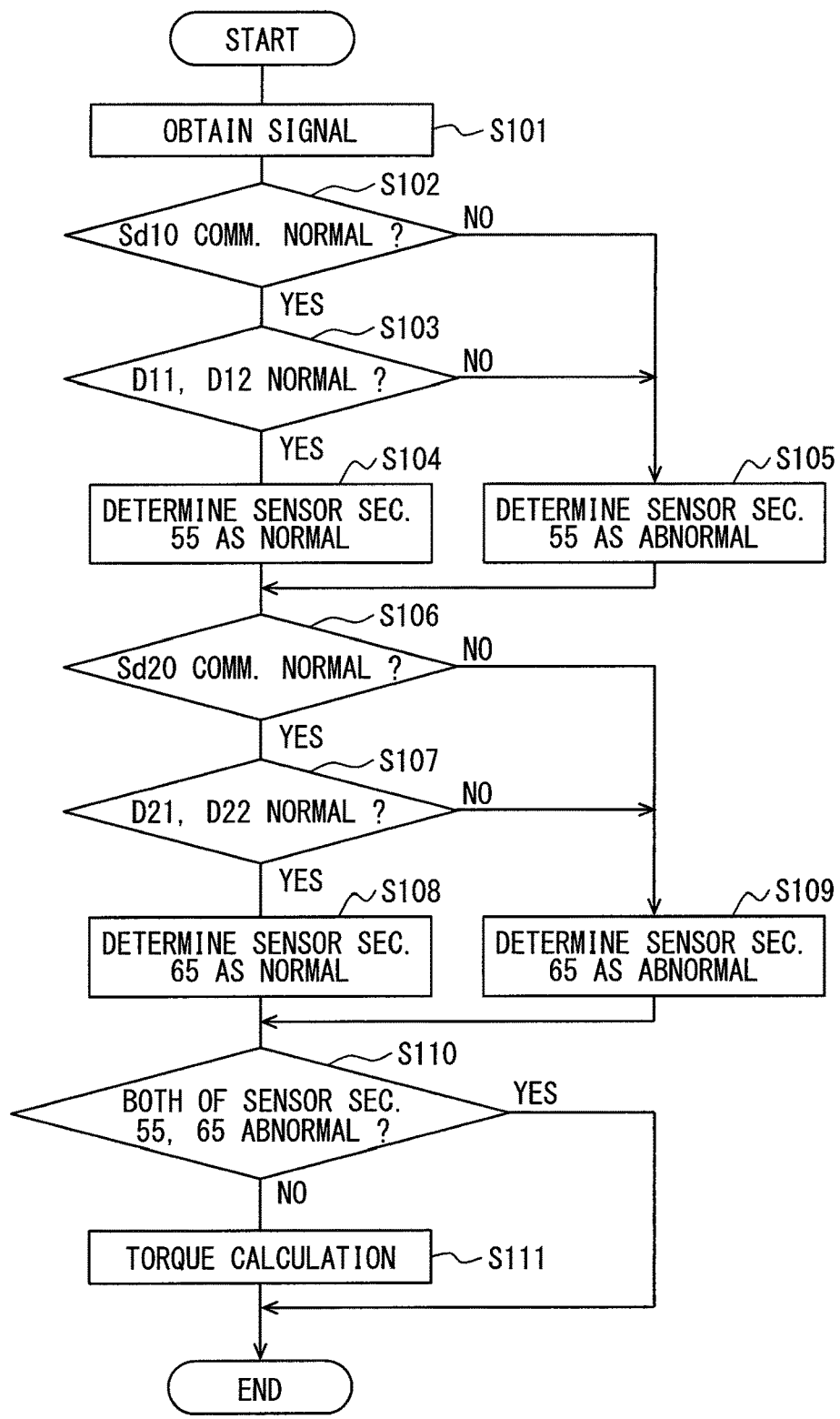
FIG. 6 is a flowchart of an the abnormality determination process in the first embodiment of the present disclosure.

The abnormality determination process of the present embodiment is described based on the flowchart shown in FIG. 6.

The abnormality determination process is performed when the magnetic sensors 50 and 60 and ECU 85 are turned ON.

In step S101 (hereafter, "step" is abbreviated to a sign "S"), the signal obtainer 851 obtains the output signals Sd10 and Sd20.

In S102, the abnormality determiner 855 determines whether communication of the first the output signal Sd10 is normal based on the CRC signal of the first output signal Sd10. When communication of the first output signal Sd10 is determined to be abnormal (S102: NO), the process proceeds to S105. When communication of the first output signal Sd10 is determined to be normal (S102: YES), the process proceeds to S103.

In S103, the abnormality determiner 855 determines whether the first main signal D11 and the first sub signal D12 are normal. When the sum of the first main signal D11 and the first sub signal D12 takes a value within a preset range containing the theoretical addition value Va, it is determined that the signals D11 and D12 are normal, and when the sum is outside of the preset range, the signal D11 or the signal D12 is determined as abnormal.

When the first main signal D11 and the first sub signal D12 are determined to be normal (S103: YES), the process proceeds to S104. When the first main signal D11 or the first sub signal D12 is determined to be abnormal (S103: NO), the process proceeds to S105.

In S104, it is determined by the abnormality determiner 855 that the first sensor section 55 is normal. In S105, the abnormality determiner 855 determines that the first sensor section 55 is abnormal.

In S106, which is subsequent to S104 or S105, the abnormality determiner 855 determines whether communication of the second output signal Sd20 is normal based on the CRC signal of the second output signal Sd20.

When communication of the second output signal Sd20 is determined as abnormal (S106: NO), the process proceeds to S109. When communication of the second output signal Sd20 is determined as normal (S106: YES), the process proceeds to S107.

In S107, the abnormality determiner 855 determines whether the second main signal D21 and the second sub signal D22 are normal. When the sum of the second main signal D21 and the second sub signal D22 takes a value within a preset range containing the theoretical addition value Va, it is determined that the signals D21 and D22 are normal, and, when the sum is outside of the preset range, the signal D21 or the signal D22 is determined as abnormal.

When the second main signal D21 and the second sub signal D22 are determined as normal (S107: YES), the process proceeds to S108. When the second main signal D21 or the second sub signal D22 is determined as abnormal (S107: NO), the process proceeds to S109.

In S108, the abnormality determiner 855 determines that the second sensor section 65 is normal. In S109, the abnormality determiner 855 determines that the second sensor section 65 is abnormal.

In S110, the abnormality determiner 855 determines whether both of the sensor sections 55 and 65 are abnormal.

When both of the output signals Sd10 and Sd20 are determined to be abnormal (S110: YES), calculation of the steering torque in S111 is not performed. When it is determined that at least one of the two sensor sections 55 and 65 is normal (S110: NO), the process proceeds to S111.

In S111, the steering torque is calculated by the calculator 858 using the output signals Sd10 and Sd20 from the sensor sections 55 and 65 that are determined as normal.

More practically, when both the output signals Sd10 and Sd20 are normal, the average value or the like of the plurality of signals D11, D12, D21, and D22 may be used, or the value of only one of the signals D11, D12, D21, and D22 may also be used, for the torque calculation.

When only one of the output signals Sd10 and Sd20 is normal, similar to the above, the average value or the like of the main signal and the sub signal may be used, or either of the main signal or the sub signal may also be used in the normal one of Sd10 and Sd20, for the torque calculation.

In the abnormality determination process of the present embodiment, even when the abnormality of the first sensor section 55 is detected, the abnormality monitoring of the second sensor section 65 is continued. Similarly, even when the abnormality of the second sensor section 65 is detected, the abnormality monitoring of the first sensor section 55 is continued.

Thereby, even when one of the sensor sections 55 and 65 has abnormality, ECU 85 can continue the torque calculation with the same accuracy as the normal time (i.e., at a time when both sensor sections have no abnormality), while continuing the self-monitoring of the normal sensor section 55 or 65.

In the present embodiment, the first output signal Sd10 is transmitted to ECU 85 from the first sensor section 55 by digital communication. By using the digital communication instead of the analog communication, the first output signal Sd10 is transmitted by a single line (i.e., by the communication line 112) is enabled to include a signal corresponding to each of the sensing values from both of the plural sensor elements 551, 552.

Thus, ECU 85 is enabled to receive information transmitted from both of the sensor elements 551, 552 (i.e., the signals corresponding to each of the sensing values of both of the two sensor elements). The same applies to the second output signal Sd20 transmitted from the second sensor section 65.

According to the present embodiment, even when the output signal Sd10 or Sd20 is determined as abnormal, ECU 85 does not provide any notification to the sensor sections 55 and 65 regarding such abnormality in the signal Sd10 or Sd20, and the sensor sections 55 and 65 continue the transmission of the output signals Sd10 and Sd20. ECU 85 then selects the signal for the torque calculation by itself, based on the abnormality determination result.

Thereby, it is not necessary for both of the sensor sections 55 and 65 to have a structure/configuration for the error/abnormality processing, which is beneficial for a simpler configuration of the sensor sections 55 and 65, and for a reduction of the failure rate of the sensor sections 55 and 65.

As described in full details above, the sensor device 1 of the present embodiment is provided with plural sensor sections 55 and 65 and ECU 85.

The first sensor section 55 has plural sensor elements 551 and 552 and the first output circuit 555. The sensor elements 551 and 552 detect the first physical quantity (e.g., the magnetic flux density between the magnetic flux collecting parts 215 and 225) about the sensing object.

The first output circuit 555 generates the first output signal Sd10 that includes the first main signal D11 and the first sub signal D12 respectively corresponding to the sensing values from the sensor elements 551 and 552, and transmits the signal Sd10 including the signals D11 and D12.

The second sensor section 65 has plural sensor elements 651 and 652 and the second output circuit 655. The sensor elements 651 and 652 detect the first physical quantity about the magnetic flux collection module 20.

The second output circuit 655 generates the second output signal Sd12 that includes the second main signal D21 and the second sub signal D22 respectively corresponding to the sensing values from the sensor elements 651 and 652, and transmits the signal Sd12 including the signals D21 and D22.

ECU 85 has the signal obtainer 851, the abnormality determiner 855, and the calculator 858.

The signal obtainer 851 obtains the first output signals Sd10 and the second output signal Sd20.

The abnormality determiner 855 determines the abnormality of the sensor sections 55 and 65.

The calculator 858 calculates the second physical quantity (e.g., the steering torque) based on the normal output signals Sd10 and Sd20.

According to the present embodiment, the first output signal Sd10 is transmitted to ECU 85 by digital communication including the first main signal D11 and the first sub signal D12 which are the data signals respectively corresponding to the sensing values of the plural sensor elements 551 and 552.

Similarly, the second output signal Sd20 is transmitted to ECU 85 by digital communication including the second main signal D21 and the second sub signal D22, which are the data signals respectively corresponding to the sensing values of the plural sensor elements 651 and 652.

Thereby, ECU 85 is enabled to use the signals D11, D12, D21, and D22 respectively corresponding to the sensing values from the plural sensor elements.

Further, the first sensor section 55 has the plural sensor elements 551 and 552, and the second sensor section 65 has the plural sensor elements 651 and 652. Therefore, even when the second sensor section 65 has abnormality, the abnormality determiner 855 is enabled to continue the self-monitoring of the first sensor section 55 based on the sensing values from the plural sensor elements 551 and 552 of the normal first sensor section 55.

Similarly, even when the first sensor section 55 has abnormality, the abnormality determiner 855 is enabled to continue the self-monitoring of the second sensor section 65 based on the sensing values from the plural sensor elements 651 and 652 of the normal second sensor section 65.

Thereby, ECU 85 is enabled to continue the calculation of the steering torque with the same accuracy as the normal time, i.e., when all the sensor sections 55 and 65 are normal, while continuing the abnormality monitoring of the normal sensor section 55 or 65, even when a part of sensor sections 55 and 65 is abnormal.

The abnormality determiner 855 determines the abnormality of the first sensor section 55 that transmits the first output signal Sd10 based on the first main signal D11 and the first sub signal D12, which are plural data signals included in the first output signal Sd10.

The abnormality determiner 855 determines the abnormality of the second sensor section 65 that transmits the second output signal Sd20 based on the second main signal D21 and the second sub signal D22, which are plural data signals included in the second output signal Sd20.

Thereby, the abnormality determiner 855 is enabled to determine the abnormality of the sensor sections 55 and 65 appropriately. Further, even when a part of the sensor sections 55 and 65 has abnormality, the abnormality determiner 855 is enabled to continue the abnormality monitoring of the normal one of the sensor sections 55 and 65.

The sensor sections 55 and 65 continue transmission of the output signals Sd10 and Sd20, when the abnormality is detected. In such case, ECU 85 selects the signal to be used for the torque calculation according to the abnormality determination result.

Thereby, it is not necessary for both of the sensor sections 55 and 65 to have a structure/configuration for the error/abnormality processing, which is beneficial for a simpler configuration of the sensor sections 55 and 65 and for a reduction of the failure rate of the sensor sections 55 and 65.

The CRC signal, which is used for the detection of the communication error, is included in the output signals Sd10 and Sd20. Thereby, the communication error is appropriately detectable.

The first main signal D11, the first sub signal D12, the second main signal D21, and the second sub signal D22 are represented by the nibble. Thereby, the signals D11, D12, D21, and D22 are transmitted to ECU 85 by the SENT communication.

The sensor elements 551, 552, 651, and 652 are respectively a magnetic flux detecting element for detecting the change of the magnetic flux of the sensing object. Further, the sensor elements 551, 552, 651, and 652 detect the change of the magnetic flux according to the change of the torque.

The calculator 858 calculates the torque as second physical quantity. More specifically, in the present embodiment, the second physical quantity is the steering torque.

That is, the sensor elements 551, 552, 651, and 652 detect the change of the magnetic flux according to the amount of the twist displacement of the torsion bar 13 in the steering system 90, and the sensor device 1 is used in the torque sensor 10. Thereby, the steering torque is appropriately detectable.

Further, ECU 85 can continue the calculation of the steering torque with the same accuracy as the normal time, while continuing the self-monitoring of the normal one of the sensor sections 55 and 65, even when a part of sensor sections 55 and 65 has abnormality.

The electric power steering apparatus 80 is provided with the sensor device 1, the motor 81, and the speed reduction gear 82. The motor 81 outputs the assist torque for assisting the steering operation of the steering wheel 91 by the driver. The speed reduction gear 82 transmits the torque of the motor 81 to the steering shaft 92, which is the drive object. ECU 85 controls the drive of the motor 81 based on the steering torque calculated based on at least one of the first main signal D11, the first sub signal D12, the second main signal D21, and the second sub signals D21.

Since the electric power steering apparatus 80 of the present embodiment can continue assistance of the steering operation of the steering wheel 91 by the driver according to the steering torque even when a part of the sensor sections 55 and 65 has abnormality, it contributes to an improvement of the safety of a vehicle.

ECU 85 may preferably notify the driver about the abnormality of a part of the sensor sections 55 and 65, when continuing the assistance of the steering operation after detecting the abnormality in a part of the sensor sections 55 and 65.

In the present embodiment, the first sensor section 55 and the second sensor section 65 correspond to the "sensor section", and the first main sensor element 551, the first sub sensor element 552, the second main sensor element 651, and the second sub sensor element 652 correspond to the "sensor element", and the first output circuit 555 and the second output circuit 655 correspond to the "output circuit."

The first main signal D11, the first sub signal D12, the second main signal D21, and the second sub signal D22 correspond to the "data signal", and the first output signals Sd10 and second output signal S d20 correspond to the "the output signal."

Second Embodiment

Figure 7:
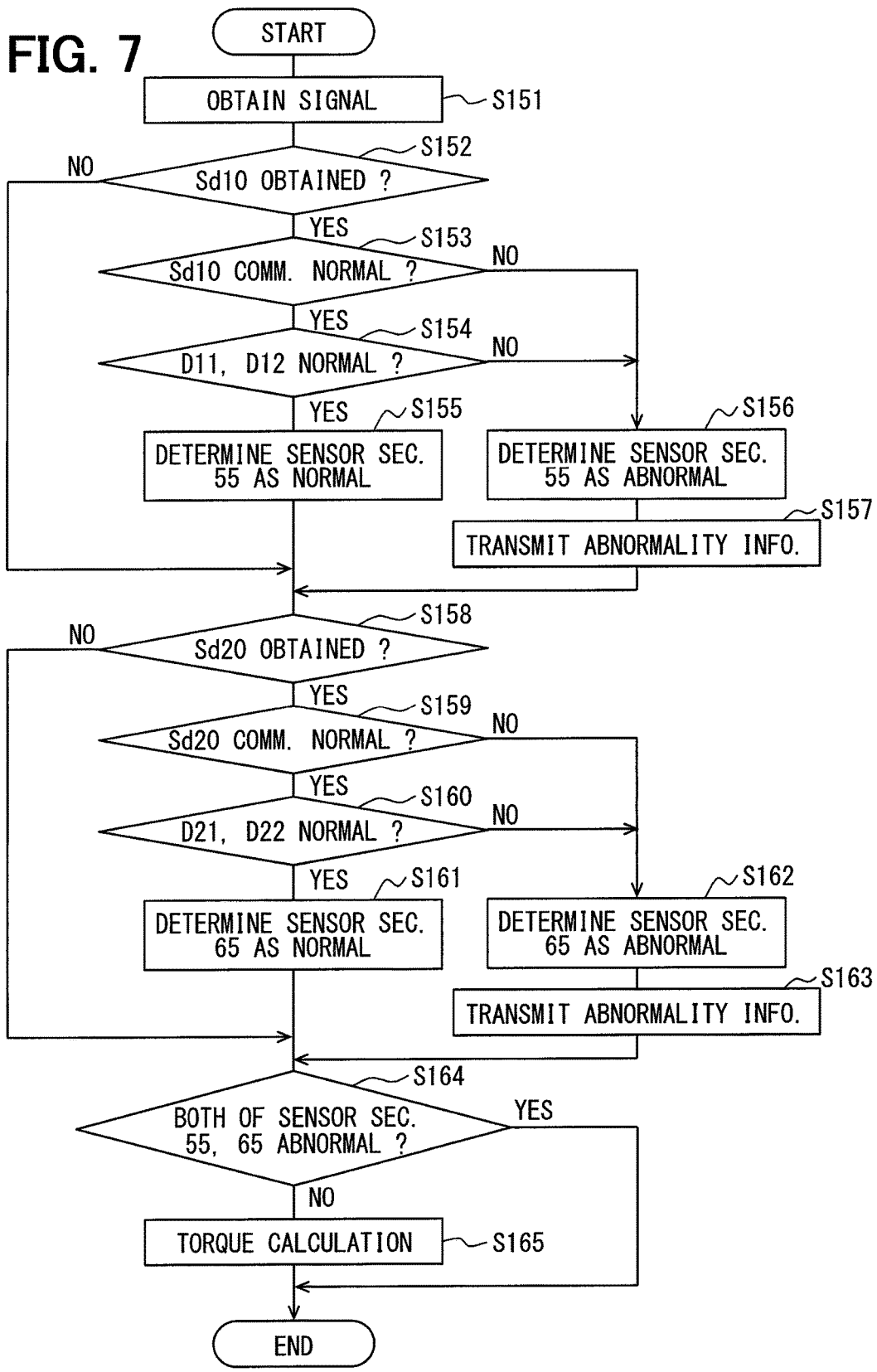
FIG. 7 is a flowchart of the abnormality determination process in a second embodiment of the present disclosure.

The second embodiment of the present disclosure is shown in FIG. 7.

The present embodiment is different from the above-described embodiment regarding the abnormality determination process, and other parts of the present embodiment are the same as the above-described embodiment. Therefore, the description of the present embodiment focuses on such difference.

The abnormality determination process of the present embodiment is described based on a flowchart shown in FIG. 7.

The process of S151 is the same as the process of S101 in FIG. 6.

In S152, the abnormality determiner 855 determines whether the first output signal Sd10 is obtained. When the first output signal Sd10 is not obtained (S152: NO), it is assumed that the first sensor section 55 has already been determined as abnormal, and the process proceeds to S158. When the first output signal Sd10 is obtained (S152: YES), the process proceeds to S153.

The processes of S153 to S156 are the same as the processes of S102 to S105. When S153 or S154 is negatively determined, the process proceeds to S156.

In S157, which is subsequent to S156, the abnormality determiner 855 transmits, to the first sensor section 55, first abnormality information which is information indicating that the first sensor section 55 is abnormal. The first sensor section 55 stops transmission of the first output signal Sd10, when receiving the first abnormality information.

In S158, which is subsequent to S155 or S157, the abnormality determiner 855 determines whether the second output signal Sd20 is obtained. When the second output signal Sd20 is not obtained (S158: NO), it is assumed that the second sensor section 65 has already been determined as abnormal, and the process proceeds to S164. When the second output signal Sd20 is obtained (S156: YES), the process proceeds to S159.

The processes of S159 to S162 are the same as the processes of S106 to S109. When S159 or S160 is negatively determined, the process proceeds to S162.

In S163, which is subsequent to S162, the abnormality determiner 855 transmits, to the second sensor section 65, second abnormality information which is information indicating that the second sensor section 65 is abnormal. The second sensor section 65 stops transmission of the second output signal Sd20, when receiving the second abnormality information.

The processes of S164 and S165 are the same as the processes of S110 and S111.

According to the present embodiment, when it is determined that the first sensor section 55 is abnormal, the abnormality determiner 855 transmits the first abnormality information that shows that the first sensor section 55 is abnormal to the first sensor section 55. Then, the first sensor section 55, which is determined as having the abnormality, stops the transmission of the first output signal Sd10.

Further, when it is determined that the second sensor section 65 is abnormal, the abnormality determiner 855 transmits the second abnormality information that shows that the second sensor section 65 is abnormal to the second sensor section 65. Then, the second sensor section 65, which is determined as having the abnormality, stops the transmission of the second output signal Sd20.

In such manner, the abnormality determination about the abnormal sensor section 55, or 65, which has already been determined as abnormal, is skippable, thereby freeing ECU 85 from the calculation load for such determination.

Further, the same effects as the above-mentioned embodiment are achievable.

According to the present embodiment, the first abnormality information and the second abnormality information correspond to "abnormality information."

Third Embodiment

The third embodiment of the present disclosure is described based on FIGS. 8 to 11.

Figure 8:
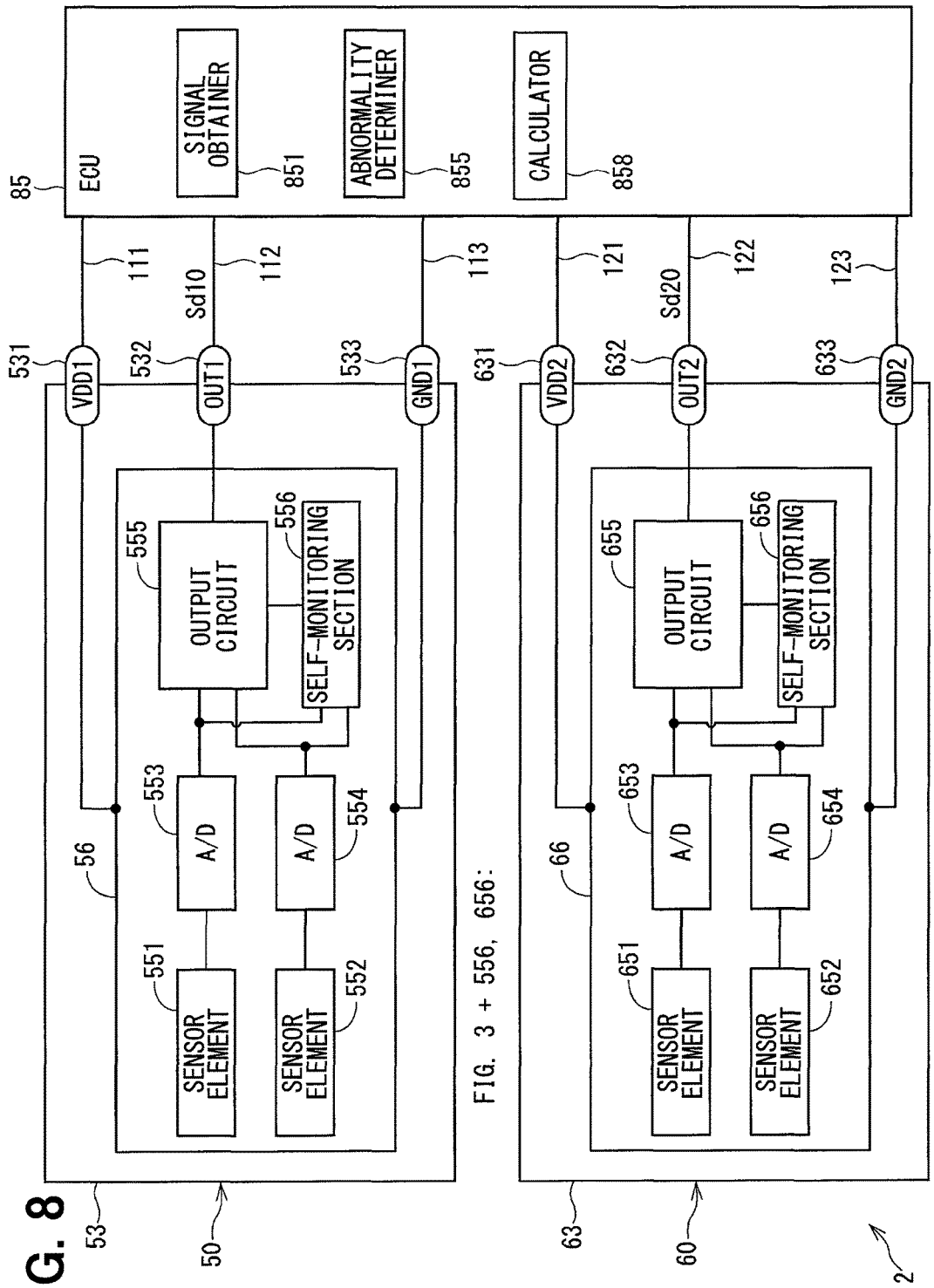
FIG. 8 is a block diagram of the sensor device in a third embodiment of the present disclosure.

As shown in FIG. 8, a sensor device 2 of the present embodiment is different from the above-mentioned embodiments in terms of configuration of a first sensor section 56 and a second sensor section 66.

The first sensor section 56 has the first main sensor element 551, the first sub sensor element 552, the A/D-conversion circuits 553 and 554, the first output circuit 555, and a self-monitoring section 556 in the present embodiment. That is, the first sensor section 56 of the present embodiment has the self-monitoring section 556, which is different from the senor section 55 in the above-mentioned embodiments. Similarly, the second sensor section 66 of the present embodiment has a self-monitoring section 656, which is different from the second sensor section 65 in the above-mentioned embodiments.

The self-monitoring section 556 compares the sensing value of the first main sensor element 551 with the sensing value of the first sub sensor element 552, and performs the abnormality determination of the first main sensor element 551 and the first sub sensor element 552.

When the sensing value of the first main sensor element 551 and the sensing value of the first sub sensor element 552 match with each other, it is determined that the first main sensor element 551 and the first sub sensor element 552 are normal, and, when the two sensing values do not match, it is determined that the first main sensor element 551 or the first sub sensor element 552 is abnormal.

When it is determined that either the first main sensor element 551 or the first sub sensor element 552 is abnormal, the first output circuit 555 stops the transmission of the first output signal Sd10.

Here, it is determined that the sensing values match with each other when a difference of the sensing values is equal to or less than a preset value, and, when a difference of the sensing values is greater than the preset value, it is determined that the sensing values do not match.

For the abnormality monitoring by the self-monitoring section 556, either an after-AD-conversion value or a before-AD-conversion value may be used.

The same applies to the abnormality monitoring by the self-monitoring section 656.

The self-monitoring section 656 compares the sensing value of the second main sensor element 651 with the sensing value of the second sub sensor element 652, and performs the abnormality determination of the second main sensor element 651 and the second sub sensor element 652.

When the sensing value of the second main sensor element 651 and the sensing value of the second sub sensor element 652 match with each other, it is determined that the second main sensor element 651 and the second sub sensor element 652 are normal, and, when the two sensing values do not match, it is determined that the second main sensor element 651 or the second sub sensor element 652 is abnormal.

When it is determined that the second main sensor element 651 or the second sub sensor element 652 is abnormal, the second output circuit 655 stops the transmission of the second output signal Sd20.

Figure 9:
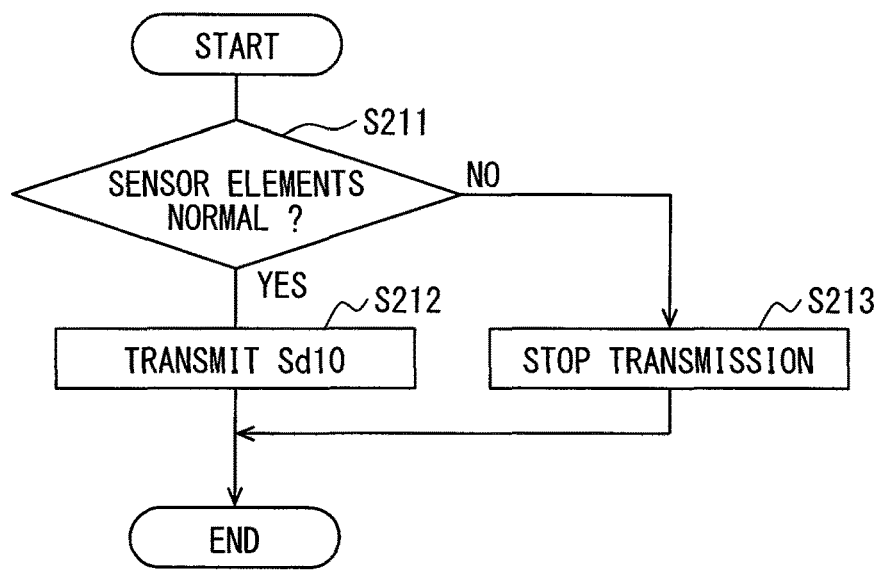
FIG. 9 is a flowchart of a self-monitoring process in a first sensor section in the third embodiment of the present disclosure.
Figure 10:
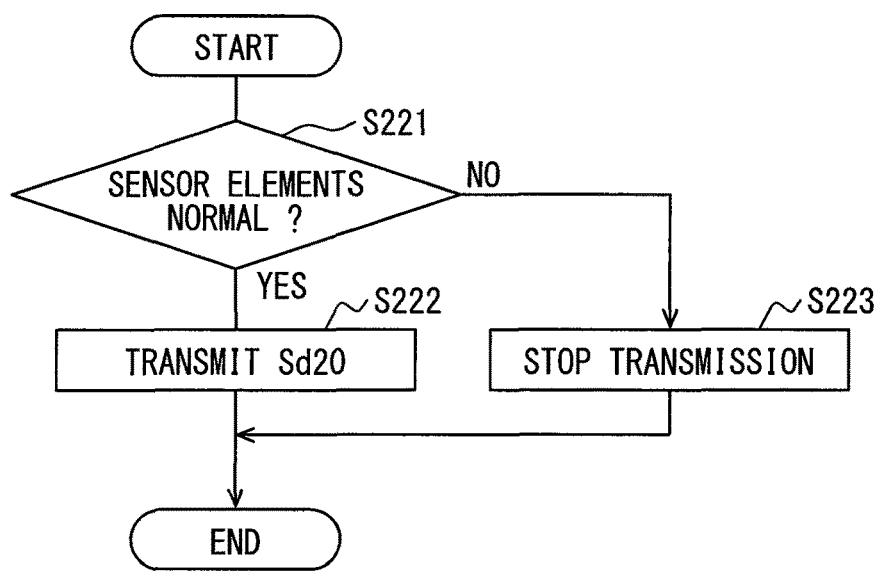
FIG. 10 is a flowchart of the self-monitoring process in the second sensor section in the third embodiment of the present disclosure.
Figure 11:
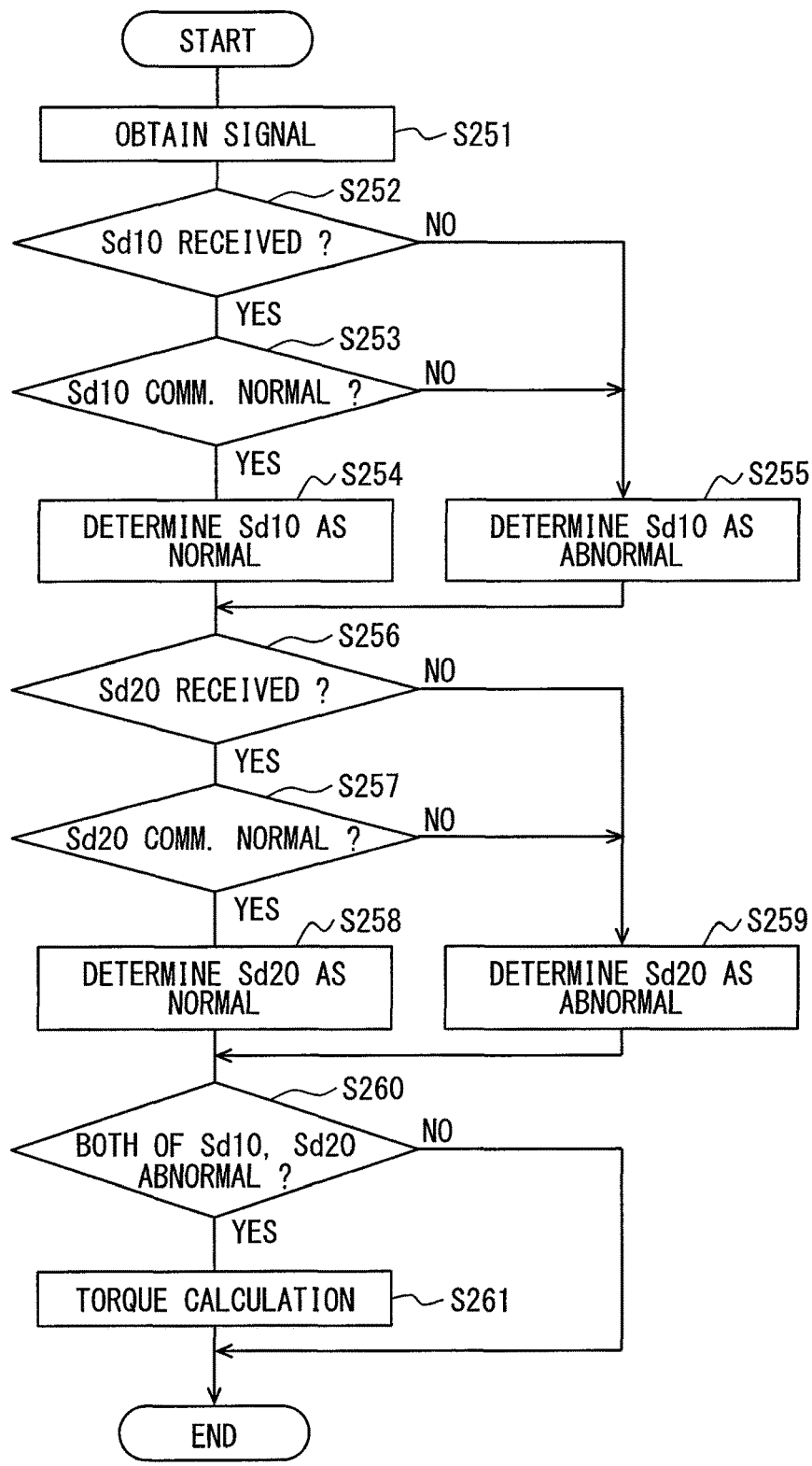
FIG. 11 is a flowchart of the abnormality determination process in the third embodiment of the present disclosure.

The abnormality determination process of the present embodiment is described based on flowcharts of FIGS. 9 to 11.

FIG. 9 shows a flowchart of a process in the first sensor section 55, FIG. 10 shows a flowchart of a process in the second sensor section 65, and FIG. 11 shows a flowchart of a process in ECU 85.

Each of the processes described in FIGS. 9 to 11 may either be a software process by executing a program pre-memorized in CPU, or may be a hardware process by a dedicated electronic circuit.

In S211 in FIG. 9, the self-monitoring section 556 determines whether the first main sensor element 551 and the first sub sensor element 552 are normal. When the self-monitoring section 556 determines that the first main sensor element 551 and the first sub sensor element 552 are normal (S211: YES), the process proceeds to S212. When the self-monitoring section 556 determines that the first main sensor element 551 or the first sub sensor element 552 is abnormal (S211: NO), the process proceeds to S213.

In S212, the first output circuit 555 transmits the first output signal Sd10.

In S213, the first output circuit 555 stops the transmission of the first output signal Sd10. That is, the first output circuit 555 does not transmit the first output signal Sd10.

In S221 in FIG. 10, the self-monitoring section 656 determines whether the second main sensor element 651 and the second sub sensor element 652 are normal. When the self-monitoring section 656 determines that the second main sensor element 651 and the second sub sensor element 652 are normal (S221: YES), the process proceeds to S222. When the self-monitoring section 656 determines that the second main sensor element 651 or the second sub sensor element 652 is abnormal (S221: NO), the process proceeds to S223.

In S222, the second output circuit 655 transmits the second output signal Sd20.

In S223, the second output circuit 655 stops the transmission of the second output signal Sd20. That is, the second output circuit 655 does not transmit the second output signal Sd20.

The process of S251 in FIG. 11 is the same as the process of S101 in FIG. 6.

In S252, the abnormality determiner 855 determines whether the first output signal Sd10 is received. When the abnormality determiner 855 determines that the first output signal Sd10 is not received (S252: NO), the process proceeds to S255. When the abnormality determiner 855 determines that the first output signal Sd10 is received (S252: YES), the process proceeds to S253.

In S253, the abnormality determiner 855 determines whether communication of the first output signal Sd10 is normal based on the CRC signal, just like S102. When communication of the first output signal Sd10 is determined as normal (S253: YES), the process proceeds to S254. When communication of the first output signal Sd10 is determined as abnormal (S253: NO), the process proceeds to S255.

The processes of S254 and S255 are the same as the processes of S104 and S105. That is, according to the present embodiment, the abnormality determiner 855 in S255 determines that the first sensor section 55 is abnormal, when the first output signal Sd10 is not received. Further, since the self-monitoring section 556 performs the abnormality monitoring of the sensor elements 551 and 552, in case that the first output signal Sd10 is received and no abnormality is observed in communication, the abnormality determiner 855 determines in S254 that the first output signal Sd10 is normal.

In S256, which is subsequent to S254 or S255, the abnormality determiner 855 determines whether the second output signal Sd20 is received. When the abnormality determiner 855 determines that the second output signal Sd20 is not received (S256: NO), the process proceeds to S259. When the abnormality determiner 855 determines that the second output signal Sd20 is received (S256: YES), the process proceeds to S257.

In S257, just like S106, based on the CRC signal, the abnormality determiner 855 determines whether communication of the second output signal Sd20 is normal. When the abnormality determiner 855 determines that communication of the second output signal Sd20 is normal (S257: YES), the process proceeds to S258. When the abnormality determiner 855 determines that communication of the second output signal Sd20 is abnormal (S257: NO), the process proceeds to S259.

The processes of S258 and S259 are the same as the processes of S108 and S109. That is, according to the present embodiment, in S259, the abnormality determiner 855 determines that the second sensor section 65 is abnormal, when the second output signal Sd20 is not received. Further, since the self-monitoring section 656 performs the abnormality monitoring of the sensor elements 651 and 652, when the second output signal Sd20 is received and no abnormality in communication is observed, the abnormality determiner 855 determines in S258 that the second output signal Sd20 is normal.

The processes of S260 and S261 are the same as the processes of S110 and the process of S111.

According to the present embodiment, the sensor sections 55 and 65 have the self-monitoring sections 556 and 656 which detect the abnormality of the sensing value.

The abnormality determiner 855 determines the abnormality of the sensor sections 55 and 65 based on the abnormality determination results of the self-monitoring sections 556 and 656. Thereby, the process by ECU 85 is reduced, and the calculation load of EUC85 is reduced.

Further, the first sensor section 55 can continue the self-monitoring of the first sensor section 55 of itself even when the second sensor section 65 is abnormal, i.e., when the "other" sensor section is abnormal.

Similarly, even when the first sensor section 55 is abnormal, the second sensor section 65 can continue the self-monitoring.

More specifically, the sensor section 55/65 stops the transmission of the output signal Sd10/Sd20, when the abnormality is detected by the self-monitoring section 556/656. The abnormality determiner 855 determines that the sensor section 55/65 is abnormal, when the output signal Sd10/Sd20 is obtained from the sensor section 55/65. Thereby, ECU 85 can determine the abnormality of the sensor sections 55, 65 appropriately based on the abnormality determination result by the self-monitoring in the sensor sections 55, 65.

Further, the same effects as the above-mentioned embodiments are achievable.

Fourth Embodiment

Figure 12:
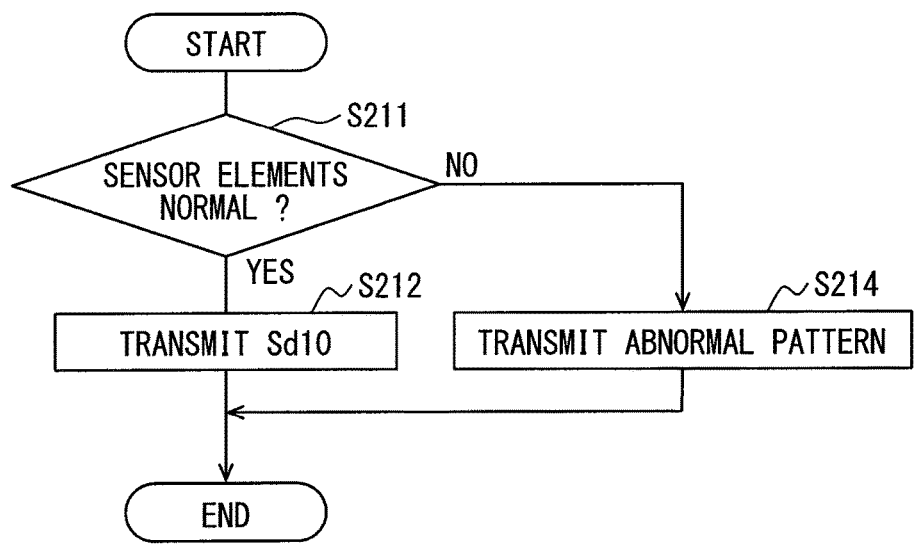
FIG. 12 is a flowchart of the self-monitoring process in the first sensor section in the fourth embodiment of the present disclosure.
Figure 13:
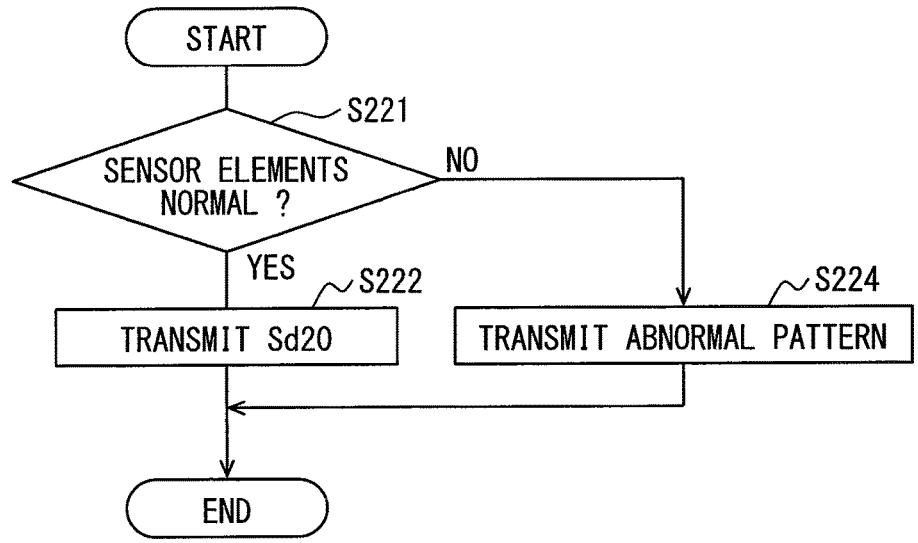
FIG. 13 is the flowchart of the self-monitoring process in the second sensor section in the fourth embodiment of the present disclosure.

The fourth embodiment of the present disclosure is shown in FIGS. 12 and 13.

Since configuration of "hardware" of the sensor device 2 in the present embodiment is the same as that of the third embodiment, description of the sensor device 2 is not repeated in the following.

The abnormality determination process in the present embodiment is shown in FIGS. 12 and 13.

FIG. 12 shows a process in the first sensor section 55, and FIG. 13 shows a process in the second sensor section 65.

In FIG. 12, the difference from the flowchart of FIG. 9 is that S214 replaces S213. That is, in S214, which is subsequent to a determination that the first main sensor element 551 or the first sub sensor element 552 is abnormal (S211: NO), instead of transmitting the normal first output signal Sd10, the first output circuit 555 transmits, to ECU 85, an abnormal pattern which shows that the first main sensor element 551 or the first sub sensor element 552 has abnormality.

In FIG. 13, the difference from the flowchart of FIG. 10 is that S224 replaces S223. That is, in S224, which is subsequent to a determination that the second main sensor element 651 or the second sub sensor element 652 is abnormal (S221: NO), instead of transmitting the normal second output signal Sd20, the second output circuit 655 transmits, to ECU 85, an abnormal pattern which shows that the second main sensor element 651 or the second sub sensor element 652 has abnormality.

The process performed by ECU 85 is the same as that of FIG. 6, except that the processes of S103 and S107 are different. In the present embodiment, the process of S103 yields a negative determination when the signal transmitted from the first sensor section 56 is the abnormal pattern, and, the process of S103 yields a positive determination when the signal from the first sensor section 56 is not the abnormal pattern.

In S107, when the signal transmitted from the second sensor section 66 is the abnormal pattern, the process of S107 yields a negative determination, and, when the signal transmitted from the second sensor section 66 is not the abnormal pattern, the process of S107 yields a positive determination.

According to the present embodiment, when the abnormality is determined by the self-monitoring section 556/656, the sensor section 55/65 transmits, to ECU 85, the abnormal pattern which shows the abnormality of the self-monitoring section 556/656.

When obtaining the signal from the sensor section 55/65 which shows the abnormal pattern, the abnormality determiner 855 determines that the sensor section 55/65 transmitting the abnormal pattern is abnormal.

Even in such manner, based on the abnormality determination result by the self-monitoring in the sensor sections 55 and 65, the abnormality of the sensor sections 55 and 65 is appropriately determined, just like the above-mentioned embodiments. Further, the process concerning the abnormality determination in ECU 85 is simplified.

The same effects as the above-mentioned embodiment are also achievable.

Other Embodiments (a) The Output Signal

In the above-mentioned embodiments, the first main signal and the first sub signal are reversed from each other, and the second main signal and the second sub signal are reversed from each other.

In other embodiments, the first main signal and the first sub signal are not necessarily reversed from each other, and the second main signal and the second sub signal are not necessarily reversed from each other.

The communication error detection signal in the above-mentioned embodiments is the CRC signal.

In other embodiments, as long as the signal is usable for detecting the communication error in the controller, a signal other than the CRC signal may also be used. Further, the output signal does not need to include the communication error detection signal.

In other embodiments, the output signal may include information on an update counter which is updated every time the output signal is transmitted. The information regarding the update counter may, for example, be included in the status signal. By transmitting the information regarding the update counter, the same data transmitted twice is determined whether it is caused by the same sensing result as the previous sensing, or whether it is caused due to a data adhesion error.

In the above-mentioned embodiments, the first main signal, the first sub signal, the second main signal, and the second sub signal are represented by the nibble.

In other embodiments, the first main signal, the first sub signal, the second main signal, and the second sub signal may be represented in forms other than the nibble.

In the above-mentioned embodiments, the output signal is transmitted to the controller by the SENT communication method.

In other embodiments, as long as the communication method is capable of including, in the output signal, the data signals respectively corresponding to the plural sensing values, the communication method may be any method.

In the above-mentioned embodiments, the first output signal and the second output signal are transmitted to the controller with the predetermined cycle.

In other embodiments, the first output signal and the second output signal may be transmitted to the controller in synchronization with a trigger signal that is transmitted, for example, from the controller. Further, a timing signal for controlling a transmission timing of the output signals may be transmitted from one of the sensor sections to the other.

The transmission timings of the first output signal and the second output signal may be the same timing, or may be different timings.

For example, the transmission timing of the first output signal may be shifted by half signal cycle from the transmission timing of the second output signal, thereby enabling the controller to receive the output signal at every half signal cycle, which improves the communication speed in appearance.

(b) Sensor Section

In the above-mentioned embodiment, two sensor elements are provided in one sensor section.

In other embodiments, three or more sensor elements may be provided in one sensor section.

If one sensor section has three or more sensor elements, the sensor section can identify an abnormal sensor element by the majority determination. By identifying an abnormal sensor element having abnormality, in case that there are at least two normal sensor elements, the abnormality monitoring is continuable.

In the above-mentioned embodiments, the plural sensor sections are sealed/molded in respectively different packages.

In other embodiments, the plural sensor sections may be sealed/molded in one package as one package.

In the above-mentioned embodiments, the plural magnetic sensors are mounted on the same surface of one substrate at side-by-side positions.

In other embodiments, the plural magnetic sensors may be mounted on both surfaces of one substrate, or mounted in any arrangement on one substrate. Further, the plural magnetic sensors may be not necessarily mounted on one substrate.

In the above-mentioned embodiments, the sensor element is the Hall element.

In other embodiments, the sensor elements may be the magnetism detecting elements other than the Hall element, or may be the elements which detect a change of physical quantity other than magnetism.

In the above-mentioned embodiments, the sensor section serves as a torque sensor detecting a steering torque.

In other embodiments, the sensor section may serve as a sensor other than the torque sensor (e.g., a pressure sensor detecting a pressure) for example. That is, the physical quantity calculated in the calculator may be a torque other than the steering torque, and may be a physical quantity other than the torque.

In the above-mentioned embodiments, the sensing object is the magnetic flux collection module.

In other embodiments, the sensing object may be any matter other than the magnetic flux collection module.

(c) The Abnormality Determination Process

In the above-mentioned embodiment, the controller performs the abnormality determination of the second sensor section subsequent to the abnormality determination of the first sensor section.

In other embodiments, the abnormality determination of the first sensor section may be performed subsequent to the abnormality determination of the second sensor section, or the abnormality determination of plural sensor sections may be performed in parallel.

(d) Sensor Device

In the above-mentioned embodiments, the sensor device is applied to the electric power steering apparatus.

In other embodiments, the sensor device may be applied to other in-vehicle devices other than the electric power steering apparatus, and may also be applied to other devices which are not disposed in a vehicle.

Although the present disclosure has been described in connection with preferred embodiment thereof with reference to the accompanying drawings, it is to be noted that various changes and modifications will become apparent to those skilled in the art, and such changes, modifications, and summarized schemes are to be understood as being within the scope of the present disclosure as defined by appended claims.

What is claimed is:

1. A sensor device comprising:
a first magnetic sensor including:

a first main sensor element configured to detect a first magnetic flux from a sensing object and to generate a first main signal based on the detected first magnetic flux;
a first sub sensor element configured to detect a second magnetic flux from the sensing object and to generate a first sub signal based on the detected second magnetic flux; and
a first output circuit configured to generate a first output signal, the first output signal including the first main signal and the first sub signal;
a second magnetic sensor including:
a second main sensor element configured to detect a third magnetic flux from the sensing object and to generate a second main signal based on the detected third magnetic flux;
a second sub sensor element configured to detect a fourth magnetic flux from the sensing object and to generate a second sub signal based on the detected fourth magnetic flux; and
a second output circuit configured to generate a second output signal, the second output signal including the second main signal and the second sub signal; and
a controller including:
a signal obtainer configured to obtain the first output signal and the second output signal;
an abnormality determiner configured to determine an abnormality of the first output signal and an abnormality of the second output signal; and
a calculator configured to calculate a steering torque based on at least one of the first output signal and the second output signal.

2. The sensor device of claim 1, wherein
the abnormality determiner is further configured
to determine an abnormality in the first magnetic sensor based on the first main signal and the first sub signal included in the first output signal, and
to determine an abnormality in the second magnetic sensor based on the second main signal and the second sub signal included in the second output signal.

3. The sensor device of claim 2, wherein
the first magnetic sensor is configured to transmit the first output signal to the signal obtainer in response to the abnormality determiner determining the abnormality in the first magnetic sensor, and wherein
the second magnetic sensor is configured to transmit the second output signal to the signal obtainer in response to the abnormality determiner determining the abnormality in the second magnetic sensor.

4. The sensor device of claim 2, wherein
the abnormality determiner is further configured
to transmit abnormality information indicative of the abnormality in the first magnetic sensor to the first magnetic sensor, and
to transmit abnormality information indicative of the abnormality in the second magnetic sensor to the second magnetic sensor, and wherein
the first magnetic sensor is configured to stop a transmission of the first output signal upon receiving the abnormality information indicative of the abnormality in the first magnetic sensor, and wherein
the second magnetic sensor is configured to stop a transmission of the second output signal upon receiving the abnormality information indicative of the abnormality in the second magnetic sensor.

5. The sensor device of claim 1, wherein
the first magnetic sensor includes a first self-monitoring section, the first self-monitoring section configured to determine an abnormality in at least one of the first main sensor element and the first sub sensor element, and wherein
the second magnetic sensor includes a second self-monitoring section, the second self-monitoring section configured to determine an abnormality in at least one of the second main sensor element and the second sub sensor element.

6. The sensor device of claim 5, wherein
the first magnetic sensor is configured to transmit a first abnormality pattern to the controller in response to the first self-monitoring section determining the abnormality in the at least one of the first main sensor element and the first sub sensor element, and wherein
the second magnetic sensor is configured to transmit a second abnormality pattern to the controller in response to the second self-monitoring section determining the abnormality in the at least one of the second main sensor element and the second sub sensor element, and wherein
the abnormality determiner is further configured
to determine an abnormality in the first magnetic sensor after receiving the first abnormality pattern, and
to determine an abnormality in the second magnetic sensor after receiving the second abnormality pattern.

7. The sensor device of claim 5, wherein
the first magnetic sensor is configured to stop a transmission of the first output signal to the controller in response to the first self-monitoring section determining the abnormality in the at least one of the first main sensor element and the first sub sensor element, and wherein
the second magnetic sensor is configured to stop a transmission of the second output signal to the controller in response to the second self-monitoring section determining the abnormality in the at least one of the second main sensor element and the second sub sensor element, and wherein
the abnormality determiner is further configured
to determine an abnormality in the first magnetic sensor in response to the controller not receiving the first output signal from the first magnetic sensor, and
to determine an abnormality in the second magnetic sensor in response to the controller not receiving the second output signal from the second magnetic sensor.

8. The sensor device of claim 1, wherein
each of the first output signal and the second output signal includes a communication error detection signal.

9. The sensor device of claim 1, wherein
each of the first main signal, the first sub signal, the second main signal, and the second sub signal is represented as a nibble.

10. The sensor device of claim 1, wherein
the sensing object is a magnetic flux collection module of a torque sensor.

11. The sensor device of claim 10, wherein
each of the first magnetic sensor and the second magnetic sensor is configured to detect a change of magnetic flux according to a change of torque detected by the torque sensor.

12. An electric power steering apparatus comprising:
a first magnetic sensor including:

a first main sensor element configured to detect a first magnetic flux from a sensing object and to generate a first main signal based on the detected first magnetic flux;

a first sub sensor element configured to detect a second magnetic flux from the sensing object and to generate a first sub signal based on the detected second magnetic flux; and a first output circuit configured to generate a first output signal based on the first main signal and the first sub signal;

a second magnetic sensor including:

a second main sensor element configured to detect a third magnetic flux from the sensing object and to generate a second main signal based on the detected third magnetic flux;

a second sub sensor element configured to detect a fourth magnetic flux from the sensing object and to generate a second sub signal based on the detected fourth magnetic flux; and a second output circuit configured to generate a second output signal based on the second main signal and the second sub signal;

a controller including:

a signal obtainer configured to obtain the first output signal and the second output signal;

an abnormality determiner configured to determine an abnormality of the first output signal and an abnormality of the second output signal; and a calculator configured to calculate a steering torque based on at least one of the first output signal and the second output signal;

a motor configured to output an assist torque for assisting a steering operation of a steering member; and a power transmission part transmitting the assist torque of the motor to a drive object, wherein the controller drives the motor based on the steering torque.

* * * * *